United States Patent
Leem et al.

(10) Patent No.: US 9,070,888 B2
(45) Date of Patent: Jun. 30, 2015

(54) PHOTOELECTRONIC DEVICE AND IMAGE SENSOR

(71) Applicant: Samsung Electronics Co., Ltd., Suwon-Si, Gyeonggi-Do (KR)

(72) Inventors: Dong-Seok Leem, Hwaseong-si (KR); Kyu Sik Kim, Yongin-si (KR); Kyung Bae Park, Hwaseong-si (KR); Kwang Hee Lee, Yongin-si (KR); Seon-Jeong Lim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/044,315

(22) Filed: Oct. 2, 2013

(65) Prior Publication Data

US 2014/0239271 A1     Aug. 28, 2014

(30) Foreign Application Priority Data

Feb. 22, 2013    (KR) .......................... 10-2013-0019421

(51) Int. Cl.
*H01L 51/44*      (2006.01)
*H01L 51/42*      (2006.01)
*H01L 27/30*      (2006.01)

(52) U.S. Cl.
CPC .......... *H01L 51/442* (2013.01); *H01L 51/4253* (2013.01); *H01L 51/4273* (2013.01); *H01L 27/307* (2013.01); *H01L 2251/308* (2013.01); *Y02E 10/549* (2013.01)

(58) Field of Classification Search
CPC .......................... H01L 51/0045; H01L 51/0036
USPC ......................................... 257/40, 432; 438/57
See application file for complete search history.

(56) References Cited

U.S. PATENT DOCUMENTS

| | | | |
|---|---|---|---|
| 2005/0217722 A1 | 10/2005 | Komatsu et al. | |
| 2009/0050878 A1 | 2/2009 | Okada et al. | |
| 2011/0073885 A1* | 3/2011 | Kim et al. | 257/89 |
| 2011/0272029 A1 | 11/2011 | Ihn et al. | |
| 2011/0297216 A1* | 12/2011 | Ihn et al. | 136/255 |
| 2013/0009138 A1* | 1/2013 | Seo et al. | 257/40 |

FOREIGN PATENT DOCUMENTS

| | | |
|---|---|---|
| JP | 2006-261172 A | 9/2006 |
| JP | 2012-009518 A | 1/2012 |
| KR | 2011-0080247 A | 7/2011 |
| KR | 2011-0122399 A | 11/2011 |
| KR | 2012-0046413 A | 5/2012 |

OTHER PUBLICATIONS

Liu et al. "High-Efficiency Inverted Polymer Solar Cells with Transparent and Work-Function Tunable $MoO_3$-Al Composite Film as Cathode Buffer Layer," Advanced Materials, 2012, 2774-2779, vol. 24, WILEY-VCH Verlag GmbH & Co. KGaA, Weinheim.

* cited by examiner

*Primary Examiner* — Phuc Dang
(74) *Attorney, Agent, or Firm* — Harness, Dickey & Pierce, P.L.C.

(57) ABSTRACT

A photoelectronic device includes a first electrode, a second electrode facing the first electrode, an active layer between the first electrode and the second electrode, and an auxiliary layer between the first electrode and the active layer, the auxiliary layer including a first auxiliary layer including a metal oxide and a metal and a second auxiliary layer including a first organic material having a HOMO energy level of greater than or equal to about 6.0 eV.

22 Claims, 11 Drawing Sheets

PHOTOELECTRONIC DEVICE AND IMAGE SENSOR

CROSS-REFERENCE TO RELATED APPLICATION

This application claims priority to and the benefit of Korean Patent Application No. 10-2013-0019421 filed in the Korean Intellectual Property Office on Feb. 22, 2013, the entire contents of which are incorporated herein by reference.

BACKGROUND

1. Field

Example embodiments provide a photoelectronic device and an image sensor.

2. Description of the Related Art

A photoelectronic device is a device for converting light into an electrical signal. The photoelectronic device may include a photodiode, a phototransistor, and the like, and may be applied to an image sensor, a solar cell, an organic light emitting diode, and the like.

An image sensor including a photodiode requires higher resolution and accordingly a smaller pixel. At present, a silicon photodiode is widely used, but it has a problem of deteriorated sensitivity since it has a smaller absorption area due to smaller pixels. Accordingly, an organic material that is capable of replacing silicon has been researched.

The organic material has a high extinction coefficient and selectively absorbs light in a particular wavelength region depending on a molecular structure, and thus may simultaneously replace a photodiode and a color filter and resultantly improve sensitivity and contribute to high integration.

In order to implement a photodiode including an organic material, control of charge mobility is required.

SUMMARY

Example embodiments provide a photoelectronic device that may improve photoelectric conversion efficiency and decrease a leakage current due to efficiently controlled charge mobility.

Example embodiments also provide an image sensor including the photoelectronic device.

According to example embodiments, a photoelectronic device includes a first electrode, a second electrode facing the first electrode, an active layer between the first electrode and the second electrode, and an auxiliary layer between the first electrode and the active layer, the auxiliary layer including a first auxiliary layer including a metal oxide and a metal and a second auxiliary layer including a first organic material having a HOMO energy level of greater than or equal to about 6.0 eV.

The first auxiliary layer may contact the first electrode, and a combined work function of the first electrode and the first auxiliary layer may be in a range of less than or equal to about 4.3 eV.

The first electrode may include at least one selected from indium tin oxide (ITO), indium zinc oxide (IZO), zinc oxide (ZnO), tin oxide (SnO), aluminum tin oxide (AlTO), and fluorine-doped tin oxide (FTO).

The metal oxide may include one of molybdenum oxide, tungsten oxide, vanadium oxide, rhenium oxide, nickel oxide, and a combination thereof.

The metal may include one of aluminum (Al), calcium (Ca), magnesium (Mg), lithium (Li), gold (Au), silver (Ag), copper (Cu), and a combination thereof.

The first auxiliary layer may include the metal in a same amount as the metal oxide or in a higher amount than the metal oxide.

The first auxiliary layer may have a thickness of about 0.1 nm to about 5 nm.

The first organic material may have a HOMO energy level of about 6.0 eV to about 7.0 eV.

The active layer may include a second organic material that is the same as or different from the first organic material, and the first organic material may have the same LUMO energy level as the second organic material or a higher LUMO energy level than the second organic material.

The first organic material may include one of DCV3T, Bpy-OXD, Bpy-FOXD, 3TPYMB, BP4MPY, BmPyPB, B3PYMPM, Bphen, and a combination thereof.

The second auxiliary layer may have a thickness of about 1 nm to about 20 nm.

The photoelectronic device may further include a third auxiliary layer between the active layer and the second electrode.

The third auxiliary layer may include a metal oxide.

The metal oxide may include one of molybdenum oxide, tungsten oxide, vanadium oxide, rhenium oxide, nickel oxide, copper oxide, titanium oxide, and a combination thereof.

The second electrode may be a light transmission electrode, and the light transmission electrode may include a light transmission layer including a metal and a metal oxide in a lesser amount than the metal.

The metal may include at least one selected from silver (Ag), aluminum (Al), copper (Cu), gold (Au), and an alloy thereof, and the metal oxide may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

The light transmission electrode may further include a transparent auxiliary layer on one side of the light transmission layer.

The transparent auxiliary layer may include a material having a refractive index of about 1.6 to about 2.5.

According to example embodiments, a photoelectronic device includes a first electrode, a second electrode facing the first electrode, an active layer between the first electrode and the second electrode, and a first auxiliary layer between the first electrode and the active layer, the first auxiliary layer including a metal oxide and a metal, and having a thickness of less than or equal to about 5 nm.

The first auxiliary layer may contact the first electrode, and a combined work function of the first electrode and first auxiliary layer may be in a range of greater than or equal to about 4.3 eV.

The first electrode may include at least one selected from indium tin oxide (ITO), indium zinc oxide (IZO), zinc oxide (ZnO), tin oxide (SnO), aluminum tin oxide (AlTO), and fluorine-doped tin oxide (FTO).

The metal oxide may include one of molybdenum oxide, tungsten oxide, vanadium oxide, rhenium oxide, nickel oxide, and a combination thereof, and the metal may include one of aluminum (Al), calcium (Ca), magnesium (Mg), lithium (Li), gold (Au), silver (Ag), copper (Cu), and a combination thereof.

The first auxiliary layer may include the metal in a same or a higher amount than the metal oxide.

The photoelectronic device may further include at least one of a second auxiliary layer between the first auxiliary layer and the active layer, and a third auxiliary layer between the active layer and the second electrode.

The second electrode may be a light transmission electrode, and the light transmission electrode may include a light transmittance layer including a metal and a metal oxide in a lesser amount than the metal.

The metal may include at least one selected from silver (Ag), aluminum (Al), copper (Cu), gold (Au), and an alloy thereof, and the metal oxide may include one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

The light transmission electrode may further include a transparent auxiliary layer on one side of the light transmission layer.

The transparent auxiliary layer may include a material having a refractive index of about 1.6 to about 2.5.

DETAILED DESCRIPTION

The present disclosure will be described more fully hereinafter with reference to the accompanying drawings, in which example embodiments of this disclosure are shown. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Parts having no relationship with the description are omitted for clarity, and the same or similar constituent elements are indicated by the same reference numerals throughout the specification.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Hereinafter, "combination" may refer to a mixture and stacked structure of two or more.

Hereinafter, a photoelectronic device according to example embodiments is described referring to FIG. 1.

Figure 1:
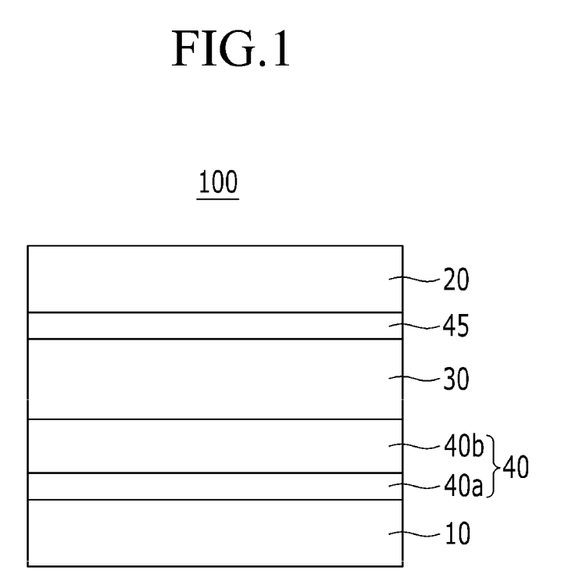
FIG. 1 is a cross-sectional view showing a photoelectronic device according to example embodiments.

FIG. 1 is a cross-sectional view showing a photoelectronic device according to example embodiments.

Referring to FIG. 1, a photoelectronic device 100 according to example embodiments includes a first electrode 10, a second electrode 20 facing the first electrode 10, an active layer 30 interposed between the first electrode 10 and second electrode 20, an auxiliary layer 40 interposed between the first electrode 10 and the active layer 30, and an auxiliary layer 45 interposed between the second electrode 20 and active layer 30.

A substrate (not shown) may be disposed on a side of the first electrode 10 and a side of the second electrode 20. The substrate may be, for example, made of an inorganic material (e.g., glass), an organic material (e.g., polycarbonate, polymethylmethacrylate, polyethylene terephthalate, polyethylene naphthalate, polyamide, polyethersulfone, or a combination thereof), or a silicon wafer.

One of the first electrode 10 and second electrode 20 may be an anode and the other may be a cathode. For example, the first electrode 10 may be a cathode and the second electrode 20 may be an anode.

The first electrode 10 may be made of, for example, a conductive oxide, for example at least one of indium tin oxide (ITO), indium zinc oxide (IZO), zinc oxide (ZnO), tin oxide (SnO), aluminum tin oxide (AlTO), and fluorine-doped tin oxide (FTO).

The second electrode 20 may be a reflecting electrode or a light transmission electrode, and may be made of, for example, a metal (e.g., aluminum (Al), gold (Au), silver (Ag), and/or copper (Cu)).

The active layer 30 includes a p-type semiconductor material and n-type semiconductor material to form a pn junction, and externally receives light, generates excitons, and separates the excitons into holes and electrons. The active layer 30 may include an intrinsic layer including both p-type semiconductors and n-type semiconductors, and may be formed, for example, using a co-deposition method and the like. The active layer 30 may further include at least one selected from a p-type layer and an n-type layer along with the intrinsic layer. The p-type layer includes a p-type semiconductor and the n-type layer includes an n-type semiconductor.

The p-type semiconductor may include, for example, N,N'-dimethylquinacridone (DMQA), diindenoperylene, dibenzo{[f,f']-4,4',7,7'-tetraphenyl}diindeno[1,2,3-cd:1',2',3'-lm]perylene, and the like, but is not limited thereto. The n-type semiconductor may include, for example, dicyanovinyl-terthiophene (DCV3T), subphthalocyane (SubPc), fullerene, a fullerene derivative, perylene diimide, and the like, but is not limited thereto.

The auxiliary layer 40 includes a first auxiliary layer 40a and a second auxiliary layer 40b.

The first auxiliary layer 40a may contact the first electrode 10, decreases an energy barrier between the first electrode 10 and the active layer 30, and increases mobility of a first charge carrier between the first electrode 10 and active layer 30. Herein, the first charge carrier is a main charge carrier moving between the first electrode 10 and the active layer 30 when a forward bias is applied to the device. For example, when the first electrode 10 is a cathode, the first charge carrier may be an electron. On the other hand, when the first electrode 10 is an anode, the first charge carrier may be a hole.

The first auxiliary layer 40a may include a metal oxide and a metal. The metal oxide may include, for example, molybdenum oxide, tungsten oxide, vanadium oxide, rhenium oxide, nickel oxide, or a combination thereof, and the metal may include, for example, aluminum (Al), calcium (Ca), magnesium (Mg), lithium (Li), gold (Au), silver (Ag), copper (Cu), or a combination thereof.

The metal oxide and metal may be included in various amounts, but an amount of the metal may be the same or a higher amount than that of the metal oxide. For example, the metal oxide and the metal may be included in a weight ratio of about 1:1 to about 1:5.

The first auxiliary layer 40a may be formed as an ultra-thin film in a nano-level, and thus may be applied for a surface layer modifying the work function of the first electrode on the surface of the first electrode 10. The first auxiliary layer 40a may have a thickness of less than or equal to about 5 nm, and for example, about 0.1 nm to about 5 nm. When the first auxiliary layer 40a has a thickness within the range, external quantum efficiency (EQE) of a device may be improved, while leakage current thereof may be decreased. Herein, the external quantum efficiency (EQE) is related to photoelectric conversion efficiency. For example, external quantum efficiency (EQE) of greater than or equal to about 40% may be secured with reference to 3 V and 540 nm, and the leakage current may be decreased to obtain a dark current of less than or equal to about 1000 e/s and detectivity of less than or equal to about $10^{12}$ Jones.

As the first auxiliary layer 40a is formed in a very thin thickness on the surface of the first electrode 10, it may be represented by the combined work function of the first electrode 10 and the first auxiliary layer 40a. The combined work function refers to a work function of the surface of the first electrode 10 formed with the first auxiliary layer 40a, and may be measured by ultraviolet photoelectron spectroscopy (UPS).

The first auxiliary layer 40a and the first electrode 10 may have a combined work function ranging, for example, from less than or equal to about 4.3 eV, or for example about 3.0 eV to about 4.3 eV. When the combined work function is within the range, an energy barrier between the first electrode 10 and the active layer 30 may be weakened, and thus charge mobility may be improved. Accordingly, external quantum efficiency (EQE) of an organic photoelectric device 100 may be improved.

For example, when the first electrode 10 includes indium tin oxide (ITO) and the first auxiliary layer 40a includes a mixture of molybdenum oxide and aluminum in a ratio of 1:1, the first electrode 10 and the first auxiliary layer 40a may have a combined work function of about 3.86 eV, which is lower than that of the indium tin oxide (ITO) of 4.6 eV. Accordingly, it is confirmed that the work function of the first electrode 10 is modified.

The second auxiliary layer 40b is positioned to be adjacent to the active layer 30, and may effectively cut off reverse movement of the second charge carriers from the first electrode 10 to the active layer 30, that is, charge leakage, when a reverse bias is applied. Herein, the second charge carrier is opposite to the first charge carrier, and may be a hole when the first electrode 10 is a cathode but an electron when the first electrode 10 is an anode.

The second auxiliary layer 40b may include an organic material having a HOMO energy level of greater than or equal to about 6.0 eV. When the second auxiliary layer 40b has a HOMO energy level within the range, movement of the second charge carriers may be cut off from the first electrode 10 to the active layer 30 when a reverse bias is applied, and thus a current leakage may be effectively decreased. The HOMO energy level may be about 6.0 eV to 7.0 eV within the range.

On the other hand, the organic material of the second auxiliary layer 40b may be the same as or different from an organic material included in the active layer 30. In addition, the organic material of the second auxiliary layer 40b may have the same LUMO energy level as or higher LUMO energy level than the organic material included in the active layer 30. Accordingly, mobility of the first charge carrier from the active layer 30 to the first electrode 10 may be improved.

The second auxiliary layer 40b may include an organic material, for example dicyanovinyl-terthiophene (DCV3T), 1,3-bis[2-(2,2'-bipyridine-6-yl)-1,3,4-oxadiazo-5-yl]benzene (Bpy-OXD), 2,7-bis[2-(2,2'-bipyridine-6-yl)-1,3,4-oxadiazo-5-yl]-9.9-dimethylfluorene (Bpy-FOXD), tris(2,4,6-trimethyl-3-(pyridine-3-yl)phenyl)borate (3TPYMB), 3,3',5,5'-tetra[(m-pyridyl)-phen-3-yl]biphenyl (BP4MPY), 1,3-bis[3,5-di(pyridine-3-yl)phenyl]benzene (BmPyPB), 4,6-bis(3,5-di(pyridin-3-yl)phenyl)-2-methylpyrimidine (B3PYMPM), 4,7-diphenyl-1,10-phenanthroline (Bphen), or a combination thereof, without limitation.

The second auxiliary layer may have a thickness of about 1 nm to about 20 nm.

The auxiliary layer 45 is disposed between the active layer 30 and second electrode 20, and facilitates the transport of holes or electrons separated from the active layer 30, to the second electrode 20, so as to increase efficiency. For example, when the second electrode 20 is an anode, the auxiliary layer 45 may include, for example, at least one selected from a hole injection layer (HIL) for facilitating hole injection, a hole transport layer (HTL) for facilitating hole transport, and an electron blocking layer (EBL) for preventing or inhibiting electron transport. When the second electrode 20 is a cathode, the auxiliary layer 45 may include, for example, at least one selected from an electron injection layer (EIL) for facilitating electron injection, an electron transport layer (ETL) for facilitating electron transport, and a hole blocking layer (HBL) for preventing or inhibiting hole transport.

The hole transport layer (HTL) may include one selected from, for example, poly(3,4-ethylenedioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4''-tris(N-carbazolyl)-triphenylamine (TCTA), tungsten oxide (WOx, 0<x≤3), molybdenum oxide (MOx, 1<x<3), vanadium oxide ($V_2O_5$), rhenium oxide, nickel oxide (NiOx, 1<x<4), copper oxide, titanium oxide, molybdenum sulfide, and a combination thereof, but is not limited thereto.

The electron blocking layer (EBL) may include one selected from, for example, poly(3,4-ethylenedioxythiophene):poly(styrene sulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]piphenyl (α-NPD), m-MTDATA, 4,4',4''-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, aluminum (Al), magnesium (Mg), molybdenum (Mo), aluminum oxide, magnesium oxide, molybdenum oxide, and a combination thereof, but not limited thereto.

The hole blocking layer (HBL) may include one selected from, for example, 1,4,5,8-naphthalene-tetracarboxylic dianhydride (NTCDA), dicyanovinyl terthiophene (DCV3T), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The auxiliary layer 45 may include a metal oxide, for example tungsten oxide (WOx, 0<x≤3), molybdenum oxide (MOx, 1<x<3), vanadium oxide ($V_2O_5$), rhenium oxide, nickel oxide (NiOx, 1<x<4), copper oxide, or titanium oxide.

The auxiliary layer 45 may be omitted as needed.

Hereinafter, a photoelectronic device according to example embodiments is described referring to FIG. 2.

Figure 2:
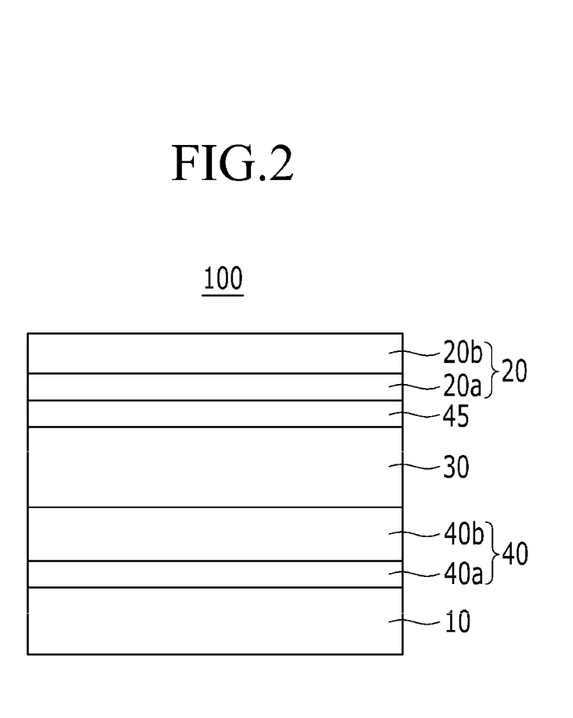
FIG. 2 is a cross-sectional view showing a photoelectronic device according to example embodiments.

FIG. 2 is a cross-sectional view showing a photoelectronic device according to example embodiments.

Referring to FIG. 2, a photoelectronic device 100 according to example embodiments includes a first electrode 10 and a second electrode 20 facing each other, an active layer 30 interposed between the first electrode 10 and second electrode 20, an auxiliary layer 40 interposed between the first electrode 10 and active layer 30, and an auxiliary layer 45 interposed between the second electrode 20 and active layer 30, and these are all the same as described in the above example embodiments.

However, the photoelectronic device 100 according to example embodiments includes the second electrode 20 as a light transmission electrode, wherein the light transmission electrode includes a light transmission layer 20a and a transparent auxiliary layer 20b.

The light transmission layer 20a may include a metal and a metal oxide, and the metal oxide may be included in a lesser amount than the metal. That is to say, the metal and the metal oxide may be included as a host and a dopant, respectively.

The metal may be a metal having transflective characteristics in a thin thickness without limitation, and for example, may include at least one selected from silver (Ag), aluminum (Al), copper (Cu), gold (Au), and an alloy thereof.

The metal oxide may be one having light transmittance without limitation, and may be, for example, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

The light transmission layer 20a may be formed, for example, in a thermal evaporation method or in a co-deposition method using a metal boat and a metal oxide boat. The thermal evaporation method may prevent or inhibit the organic material of the active layer 30 from being damaged by plasma during physical deposition (e.g., sputtering), and thus may prevent or reduce degradation of the active layer 30 during the manufacturing process.

The metal and the metal oxide may be included in a weight ratio of about 99.9:0.1 to about 60:40. When the metal and the metal oxide are included within the weight ratio, the light transmission layer 20a may improve light transmission but not sharply deteriorate conductivity, and resultantly may secure electrical characteristics. Specifically, the metal and the metal oxide are included in a weight ratio ranging from about 99.0:1.0 to about 80:20 within the range.

The light transmission layer 20a may have a thickness ranging from about 1 nm to 50 nm. When the light transmission layer 20a has a thickness within the range, electrical characteristics as well as light transmittance may be secured. The light transmission layer 20a may have a thickness ranging from about 3 nm to 30 nm within the range.

The light transmission layer 20a may have sheet resistance of less than or equal to about 1 kΩ/sq and may simultaneously have light transmittance of higher than 50% at a wavelength of 540 nm. The sheet resistance may be, for example, in a range of about 20 Ω/sq to 800 Ω/sq. The light transmittance may be, for example, higher than about 50% but lower than about 95%.

The transparent auxiliary layer 20b is disposed at a side where light enters, and may lower reflectance of incident light and further improve light absorption.

The transparent auxiliary layer 20b may include, for example, a material having a refractive index of about 1.6 to about 2.5 and at least one selected from a metal oxide, a metal sulfide, and an organic material having a refractive index within the range.

The metal oxide may include, for example, zinc oxide, indium oxide, tin oxide, indium tin oxide (ITO), indium zinc oxide (IZO), aluminum oxide, aluminum tin oxide (ATO), fluorine-doped tin oxide (FTO), molybdenum oxide, tungsten oxide, vanadium oxide, rhenium oxide, niobium oxide, tantalum oxide, titanium oxide, nickel oxide, copper oxide, cobalt oxide, manganese oxide, chromium oxide, tellurium oxide ($TeO_2$), or a combination thereof, the metal sulfide may include, for example, zinc sulfide (ZnS), and the organic material may include, for example, an amine derivative.

The photoelectronic device may be applied to various fields, for example a solar cell, an image sensor, a photo-detector, a photo-sensor, and an organic light emitting diode (OLED), but is not limited thereto.

Hereinafter, an example of an image sensor including the photoelectronic device is described referring to drawings. As an example of an image sensor, an organic CMOS image sensor is described.

Figure 3:
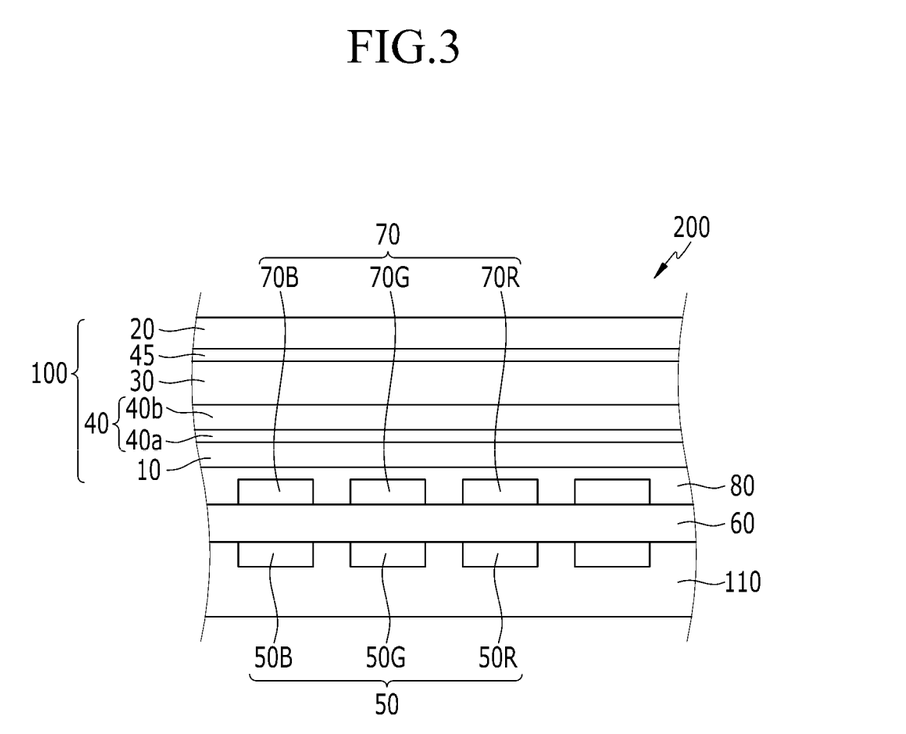
FIG. 3 is a cross-sectional view showing an organic CMOS image sensor according to example embodiments.

FIG. 3 is a cross-sectional view showing an organic CMOS image sensor according to example embodiments.

FIG. 3 exemplarily explains adjacent blue, green, and red pixels, but is not limited thereto. Hereinafter, a constituent element including "B" in the reference symbol refers to a constituent element included in the blue pixel, a constituent element including "G" refers to a constituent element included in the green pixel, and a constituent element including "R" in the reference symbol refers to a constituent element included in the red pixel.

Referring to FIG. 3, an organic CMOS image sensor 200 includes a semiconductor substrate 110 integrated with a photo-sensing device 50 and a transmission transistor (not shown), a lower insulation layer 60, color filters 70B, 70G, and 70R, an upper insulation layer 80, and a photoelectronic device 100.

The semiconductor substrate 110 may be a silicon substrate, and is integrated with the photo-sensing device 50 and a transmission transistor (not shown). The photo-sensing device 50 may be a photodiode. The photo-sensing device 50 and the transmission transistor may be integrated in each pixel, and as shown in the drawing, the photo-sensing device 50 includes a blue pixel photo-sensing device 50B, a green pixel photo-sensing device 50G, and a red pixel photo-sensing device 50R. The photo-sensing device 50 senses light, and the information sensed by the photo-sensing device 50 is transferred by a transmission transistor.

Metal wires (not shown) and pads (not shown) are formed on the semiconductor substrate 110. In order to decrease signal delay, the metal wires and pads may be made of a metal having low resistivity, for example, aluminum (Al), copper (Cu), silver (Ag), and alloys thereof, but is not limited thereto.

The lower insulation layer 60 is formed on the metal wires and pads. The lower insulation layer 60 may be made of an inorganic insulating material (e.g., silicon oxide and/or silicon nitride), or a low dielectric constant (low K) material (e.g., SiC, SiCOH, SiCO, and SiOF).

The lower insulation layer 60 has a trench (not shown) exposing each photo-sensing device 50B, 50G, and 50R of each pixel. The trench may be filled with fillers.

A color filter 70 is formed on the lower insulation layer 60. The color filter 70 includes the blue filter 70B formed in the blue pixel, the green filter 70G formed in the green pixel, and the red filter 70R filled in the red pixel. The upper insulation layer 80 is formed on the color filter 70. The upper insulation layer 80 eliminates a step caused by the color filters 70 and planarizes the surface. The photoelectronic device 100 is formed on the upper insulation layer 80.

The photoelectronic device 100 includes a first electrode 10 and a second electrode 20 facing each other, an active layer 30 interposed between the first electrode 10 and second electrode 20, an auxiliary layer 40 interposed between the first electrode 10 and the active layer 30, and an auxiliary layer 45 interposed between the second electrode 20 and active layer 30, as described above. The drawing shows an example in which the first electrode 10 is disposed on the upper insulation layer 80, but the second electrode 20 may be positioned on the upper insulation layer 80.

Both the first electrode 10 and the second electrode 20 may be, for example, a light transmission electrode, and the active layer 30 may include an organic material absorbing light of the visible ray region.

The light incident from the first electrode 10 or the second electrode 20 may be photoelectrically converted at the active layer 30, may be passed through the first electrode 10 or the second electrode 20, and may be sensed by a photo-sensing device 50.

The organic CMOS image sensor including the above-described photoelectronic device 100 according to example embodiments increases charge mobility between an electrode and an active layer to secure external quantum efficiency (EQE) and also decreases a current in a reverse bias state, that is, a leakage current, to improve sensing performance by sensing a current produced by light.

Figure 4:
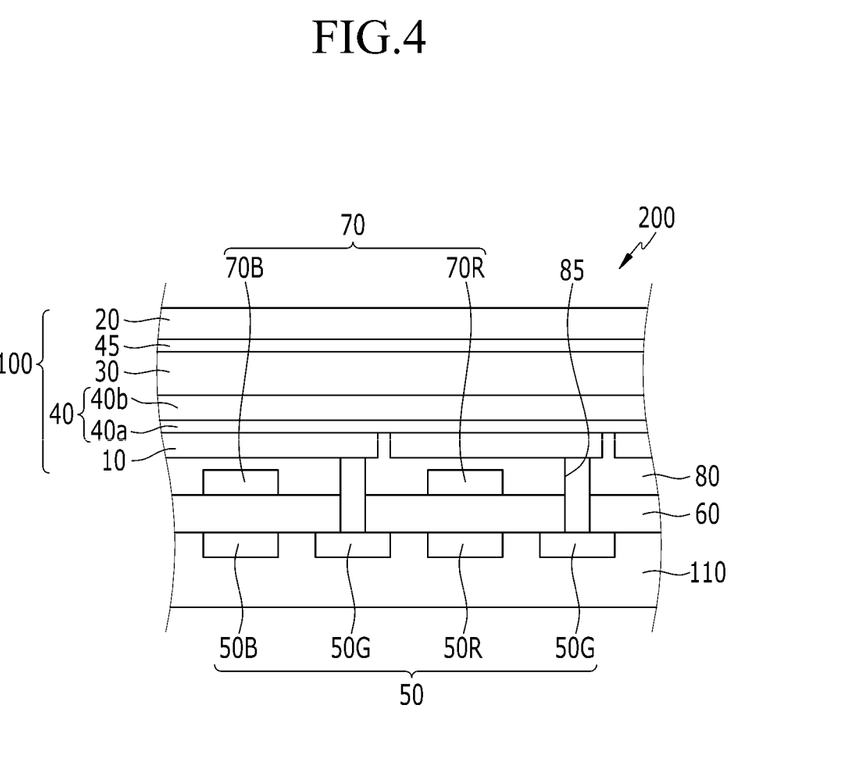
FIG. 4 is a cross-sectional view showing an organic CMOS image sensor according to example embodiments.

FIG. 4 is a cross-sectional view showing an organic CMOS image sensor according to example embodiments.

The organic CMOS image sensor 200 according to example embodiments includes a semiconductor substrate 110 integrated with a photo-sensing device 50 and a transmission transistor (not shown), a lower insulation layer 60, a color filter 70, an upper insulation layer 80, and a photoelectronic device 100, as above.

However, the organic CMOS image sensor 200 according to example embodiments may omit the green filter 70G, different from the above example embodiment illustrated in FIG. 3, and instead may substitute the active layer 30 of the photoelectronic device 100 for the green filter 70G. The active layer 30 of the photoelectronic device 100 may include, for example, an organic material mainly adsorbing light in a green wavelength region, and the light incident from the light transmission metal electrode may be photoelectrically converted by mainly adsorbing light in the green wavelength region at the active layer 30, while light in the other wavelength regions is passed through the first electrode 10 or the second electrode 20 and sensed by a photo-sensing device 50. The upper insulation layer 80 and lower insulation layer 60 have through-holes 85 to expose a photo-sensing device 50G of a green pixel.

However, when the active layer 30 of the photoelectronic device 100 includes an organic material that mainly absorbs light of a red wavelength region and an organic material that mainly absorbs light of a blue wavelength region, a red filter 70R or a blue filter 70B may be substituted with the active layer 30.

Hereinafter, the present disclosure is illustrated in more detail with reference to examples. However, these embodiments are examples, and the present disclosure is not limited thereto.

Manufacture of Photoelectronic Device 1

Example 1-1

A ITO is sputtered on a glass substrate to form 100 nm-thick lower electrode. On the lower electrode, a molybdenum oxide (MoOx, 0<x≤3) and aluminum (Al) are thermally evaporated in a ratio of 1:1 (wt/wt) to form a lower auxiliary layer as a 5 nm-thick monolayer. Next, dicyanovinyl-terthiophene (DCV3T):N,N'-dimethylquinacridone (DMQA) is co-deposited on the lower auxiliary layer in a ratio of 1:1 to form a 70 nm-thick active layer. On the active layer, molybdenum oxide (MoOx, 0<x≤3) is thermally evaporated to form a 30 nm-thick upper auxiliary layer. Then, aluminum (Al) is thermally evaporated on the upper auxiliary layer to form a 100 nm-thick upper electrode, manufacturing a photoelectronic device.

Example 1-2

A photoelectronic device is manufactured according to the same method as Example 1-1, except for forming a double lower auxiliary layer by sequentially thermally evaporating a mixture of molybdenum oxide (MoOx, 0<x≤3) and aluminum (Al) (1:1 wt/wt) to be 5 nm thick and dicyanovinyl-terthiophene (DCV3T) (HOMO: 6.1 eV, LUMO: 3.9 eV) to be 10 nm thick.

Example 1-3

A photoelectronic device is manufactured according to the same method as Example 1-1, except for forming a double lower auxiliary layer by sequentially thermally evaporating a mixture of molybdenum oxide (MoOx, 0<x≤3) and aluminum (Al) (1:1 wt/wt) to be 3 nm thick and dicyanovinyl-terthiophene (DCV3T) (HOMO: 6.1 eV, LUMO: 3.9 eV) to be 10 nm thick.

Comparative Example 1

A photoelectronic device is manufactured according to the same method as Example 1-1, except for including no lower auxiliary layer.

Comparative Example 2

A photoelectronic device is manufactured according to the same method as Example 1-2, except for forming a 10 nm-thick dicyanovinyl-terthiophene (DCV3T) monolayer as a lower auxiliary layer instead of the double lower auxiliary layer.

Comparative Example 3

A photoelectronic device is manufactured according to the same method as Example 1-1, except for forming a 10 nm-thick monolayer including molybdenum oxide (MoOx) and aluminum (Al) in a ratio of 1:1 as a lower auxiliary layer instead of the 5 nm-thick monolayer including molybdenum oxide (MoOx) and aluminum (Al) in a ratio of 1:1.

Evaluation 1

The photoelectronic device according to Examples 1-1 to 1-3 and Comparative Examples 1 to 3 are evaluated regarding external quantum efficiency (EQE) and leakage current. The leakage current may be evaluated using a dark current characteristic and detectivity, and the dark current may be evaluated from a current flowing when a reverse bias is applied to the devices. Herein, the detectivity is obtained by dividing the external quantum efficiency (EQE) by the leakage current.

The external quantum efficiency (EQE) is evaluated in an IPCE (incident photon to current efficiency) method, the dark current is evaluated using an I-V parameter analyzer, and the detectivity is evaluated by converting the two values into a formula.

Figure 5:
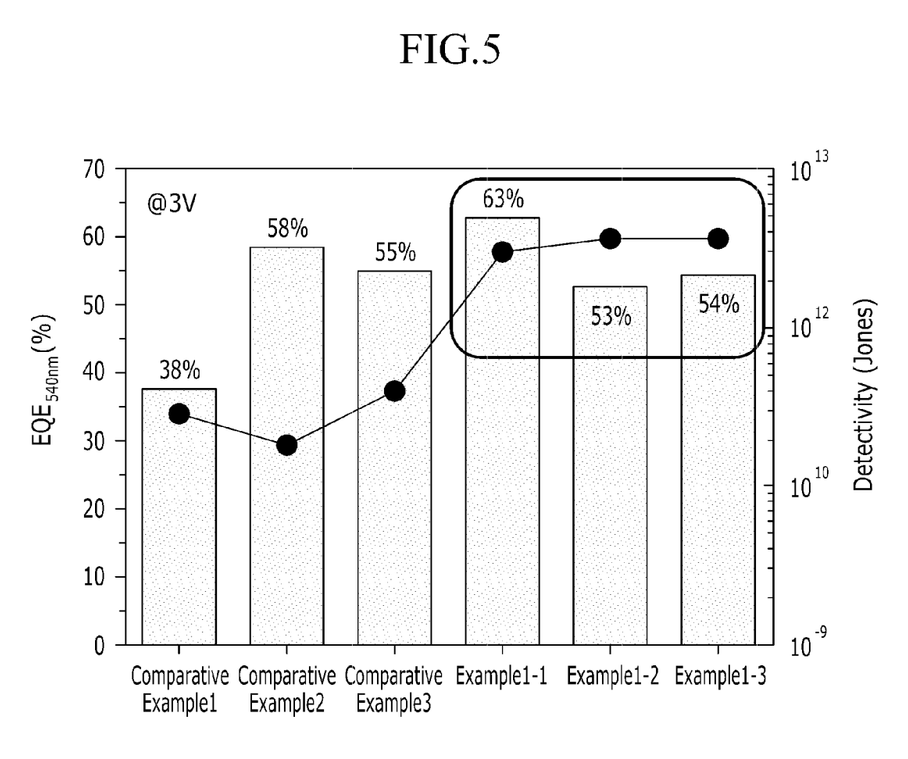
FIG. 5 is a graph showing external quantum efficiency (EQE) and detectivity of the photoelectronic devices according to Examples 1-1 to 1-3 and Comparative Examples 1 to 3.
Figure 6:
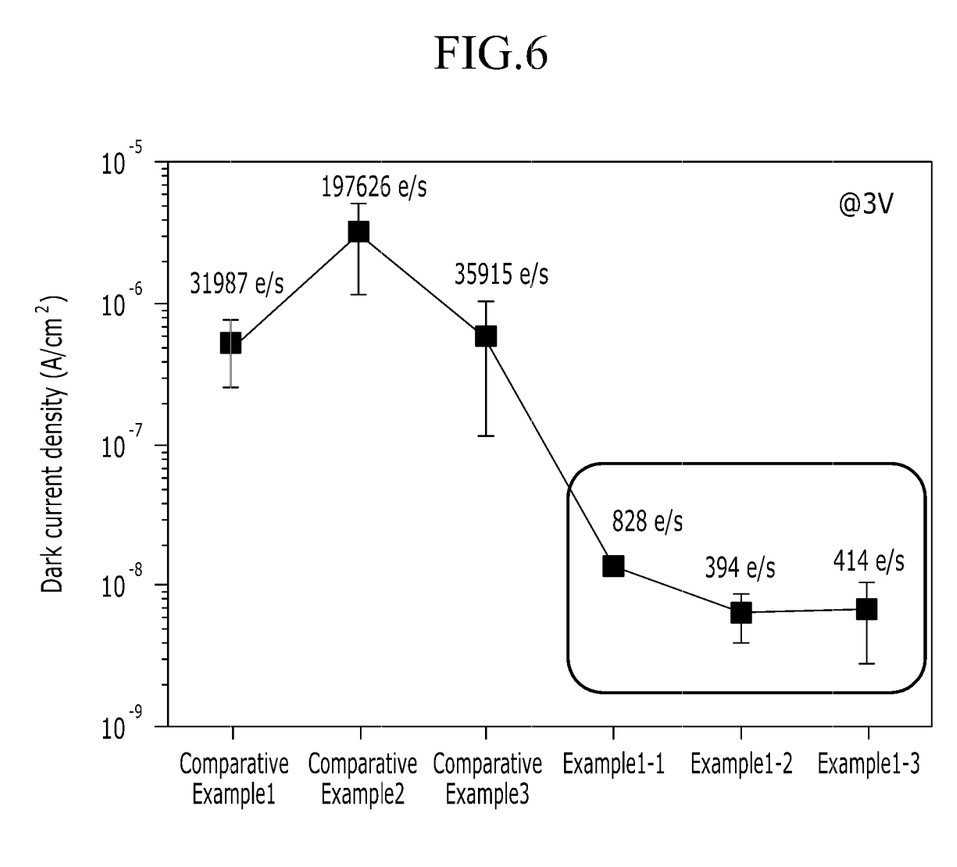
FIG. 6 is a graph showing dark current characteristics of the photoelectronic device according to Examples 1-1 to 1-3 and Comparative Examples 1 to 3.

The results are provided in FIGS. 5 and 6.

FIG. 5 is a graph showing external quantum efficiency (EQE) and detectivity of the photoelectronic devices according to Examples 1-1 to 1-3 and Comparative Examples 1 to 3, and FIG. 6 is a graph showing dark current characteristics of the photoelectronic device according to Examples 1-1 to 1-3 and Comparative Examples 1 to 3.

Referring to FIG. 5, the photoelectronic devices according to Examples 1-1 to 1-3 simultaneously have satisfactory external quantum efficiency (EQE) and detectivity compared with those of Comparative Examples 1 to 3. Specifically, the photoelectronic devices according to Examples 1-1 to 1-3 have external quantum efficiency (EQE) of greater than or equal to about 40% with reference to 3 V and 540 nm, and also secure detectivity of greater than or equal to about $10^{12}$ Jones.

Referring to FIG. 6, the photoelectronic devices according to Examples 1-1 to 1-3 has a sharply deteriorated leakage current compared with those of Comparative Examples 1 to 3. Specifically, the photoelectronic devices according to Examples 1-1 to 1-3 has a dark current characteristic of less than or equal to about 1000 e/s with reference to 3 V.

Manufacture of Photoelectronic Device 2

Example 2

An ITO is sputtered on a glass substrate to form a 100 nm-thick lower electrode. On the lower electrode, a mixture of molybdenum oxide (MoOx, 0<x≤3) and aluminum (Al) (1:1 wt/wt) and B3PYMPM (HOMO: 6.8 eV, LUMO: 3.2 eV) are sequentially thermally evaporated to form a double lower auxiliary layer to be 5 nm thick, respectively. On the lower auxiliary layer, dicyanovinyl-terthiophene (DCV3T):N,N'-dimethylquinacridone (DMQA) is deposited at a ratio of 1:1 to form an active layer of 70 nm thick. Then, on the active layer, a molybdenum oxide (MoOx, 0<x≤3) is thermally evaporated to form a 30 nm-thick upper auxiliary layer. On the upper auxiliary layer, an aluminum (Al) is thermally evaporated to form a 100 nm-thick upper electrode, manufacturing a photoelectronic device.

Evaluation 2

The photoelectronic device according to Example 2 is evaluated regarding external quantum efficiency (EQE) and leakage current.

Figure 7:
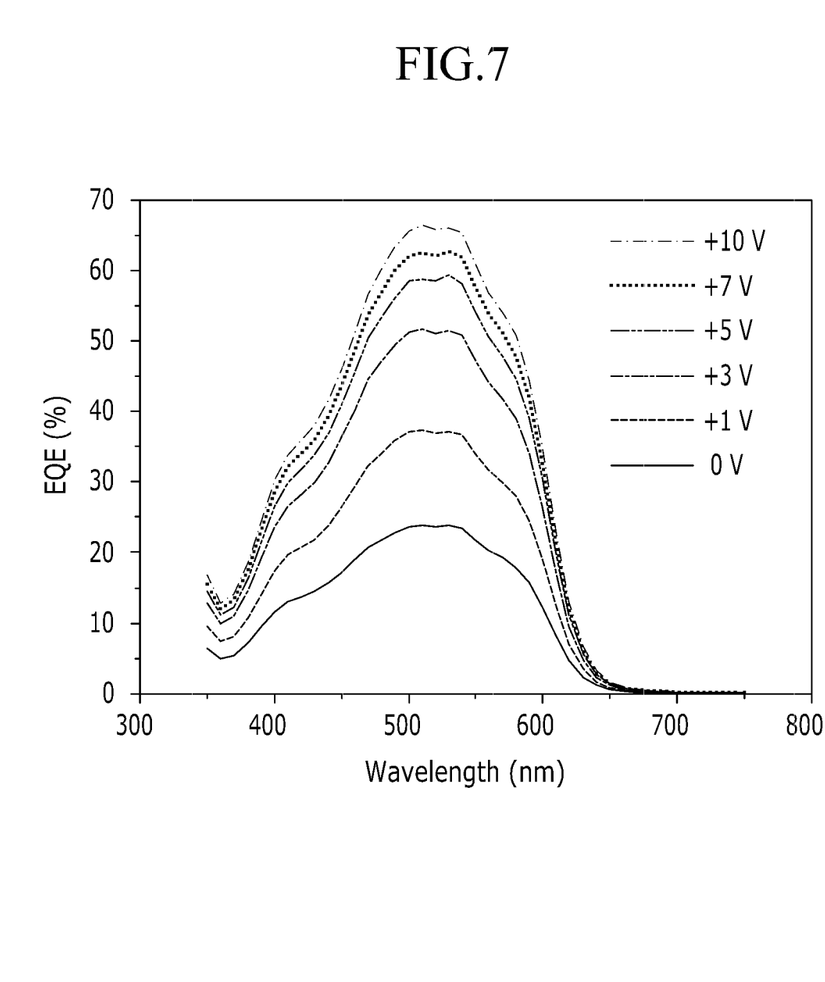
FIG. 7 is a graph showing external quantum efficiency (EQE) depending on a voltage and a wavelength of the photoelectronic device according to Example 2.
Figure 8:
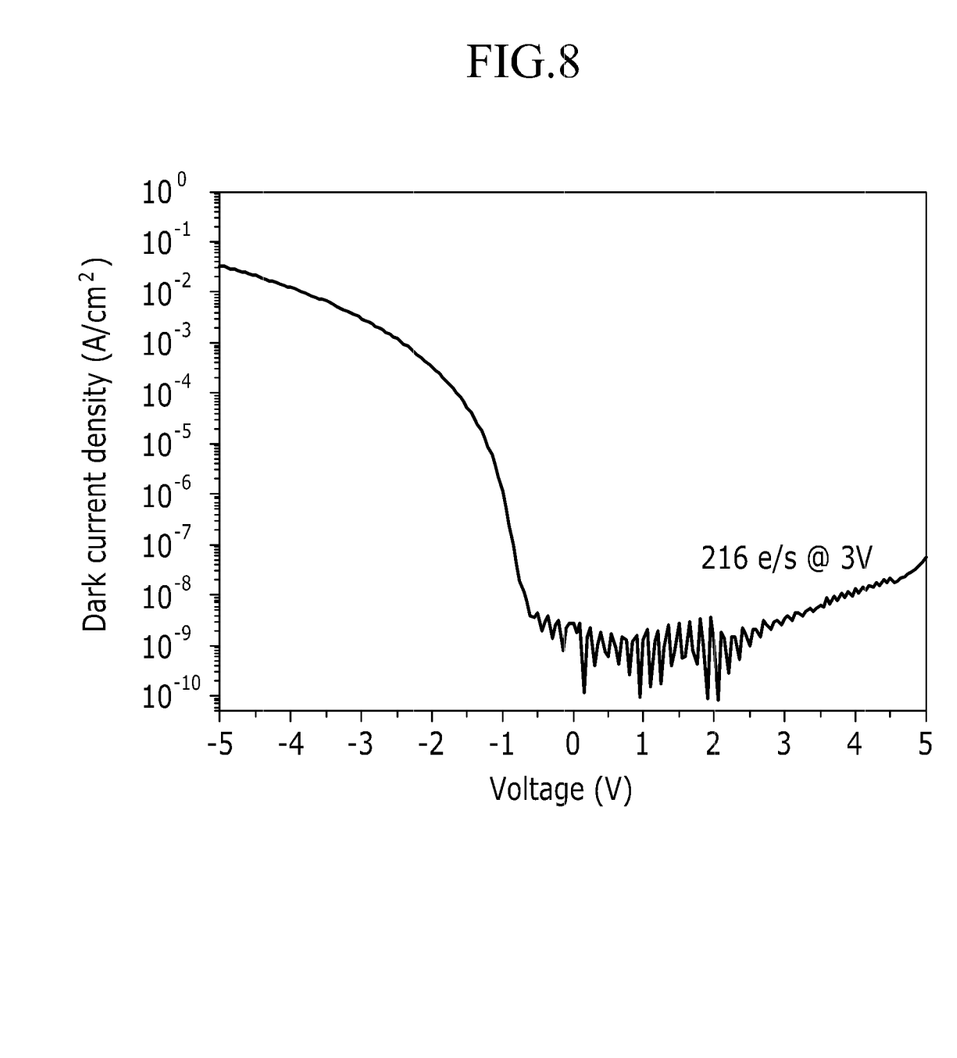
FIG. 8 is a graph showing dark current characteristics of the photoelectronic device according to Example 2.

The results are provided in FIGS. 7 and 8.

FIG. 7 is a graph showing external quantum efficiency (EQE) depending on a voltage and a wavelength of the photoelectronic device according to Example 2, and FIG. 8 is a graph showing dark current characteristics of the photoelectronic device according to Example 2.

Referring to FIG. 7, the photoelectronic device according to Example 2 has sufficient external quantum efficiency (EQE), and specifically has external quantum efficiency (EQE) of greater than or equal to about 40% with reference to 3 V and 540 nm.

Referring to FIG. 8, the photoelectronic device according to Example 2 has a sufficient leakage current characteristic, and specifically has a dark current characteristic of 216 e/s with a reference to 3 V.

Manufacture of Photoelectronic Device 3

Example 3

An ITO is sputtered on a glass substrate to form a 100 nm-thick lower electrode. On the lower electrode, a mixture of rhenium oxide (ReO$_3$ or Re$_2$O$_7$) and aluminum (Al) (1:1 wt/wt) and dicyanovinyl-terthiophene (DCV3T) are sequentially thermally evaporated to form a double lower auxiliary layer of 5 nm and 10 nm thick, respectively.

On the lower auxiliary layer, dicyanovinyl-terthiophene (DCV3T):N,N'-dimethylquinacridone (DMQA) is deposited in a ratio of 1:1 to form a 70 nm-thick active layer. On the active layer, a molybdenum oxide (MoOx, 0<x≤3) is thermally evaporated to form a 30 nm-thick upper auxiliary layer. Then, on the upper auxiliary layer, an aluminum (Al) is thermally evaporated to form a 100 nm-thick upper electrode, manufacturing a photoelectronic device.

Evaluation 3

The photoelectronic device according to Example 3 is evaluated regarding external quantum efficiency (EQE) and leakage current.

Figure 9:
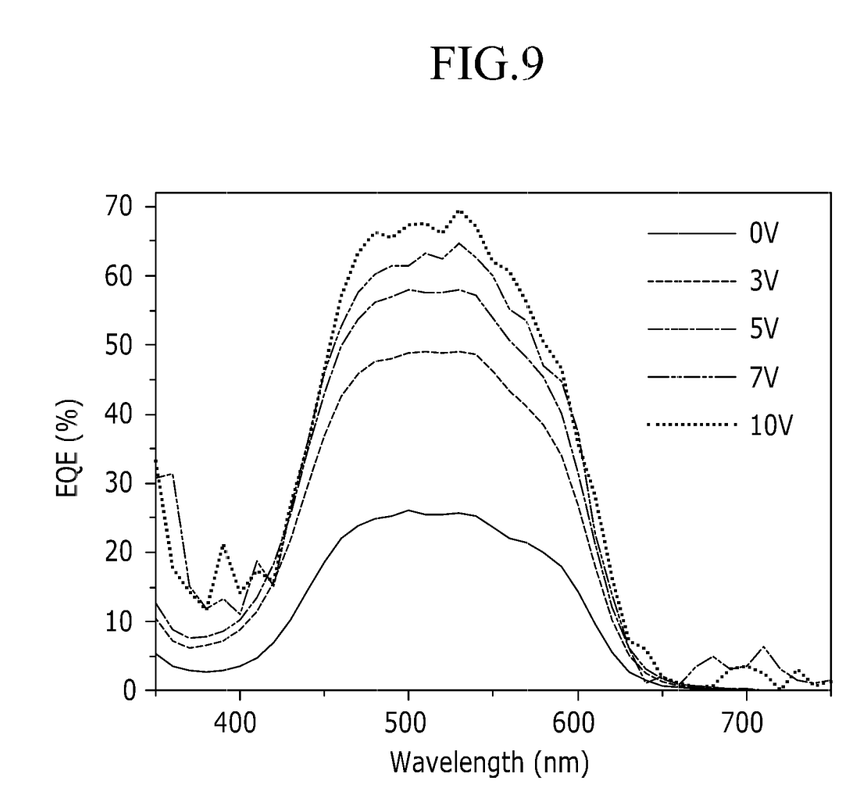
FIG. 9 is a graph showing external quantum efficiency (EQE) depending on a voltage and a wavelength of the photoelectronic device according to Example 3.
Figure 10:
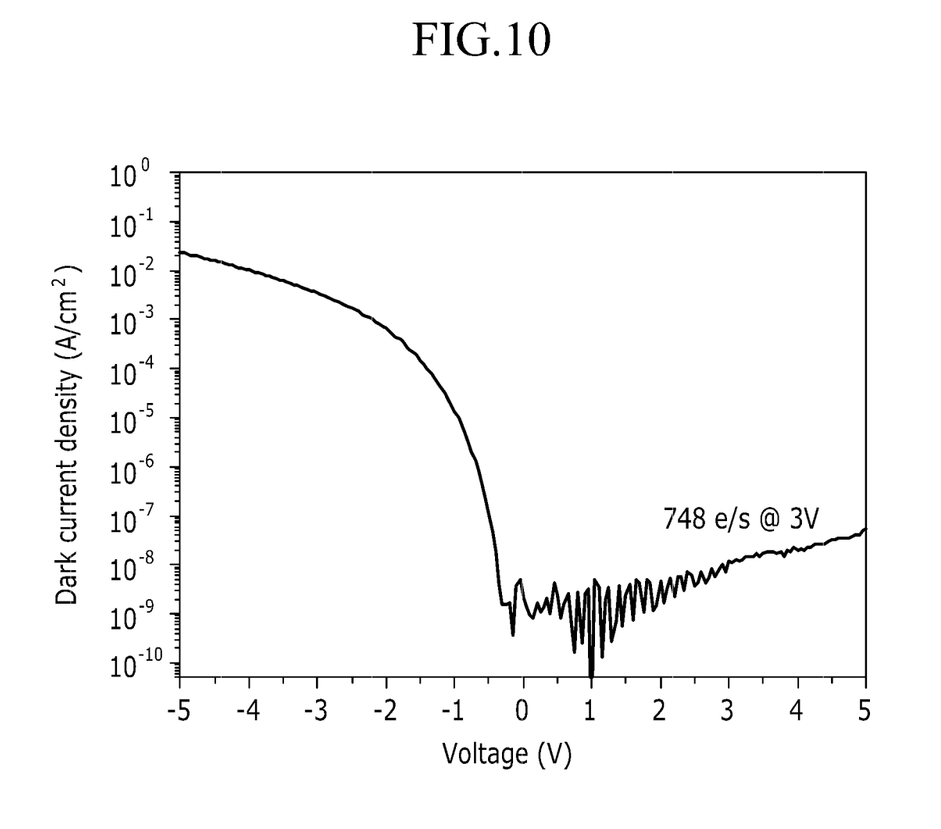
FIG. 10 is a graph showing dark current characteristics of the photoelectronic device according to Example 3.

The results are provided in FIGS. 9 and 10.

FIG. 9 is a graph showing external quantum efficiency (EQE) depending on a voltage and a wavelength of the photoelectronic device according to Example 3, and FIG. 10 is a graph showing dark current characteristics of the photoelectronic device according to Example 3.

Referring to FIG. 9, the photoelectronic device according to Example 3 has sufficient external quantum efficiency (EQE), and specifically has external quantum efficiency (EQE) of greater than or equal to about 40% with a reference to 3 V and 540 nm.

Referring to FIG. 10, the photoelectronic device according to Example 3 has a sufficient leakage current characteristic, and specifically has a dark current characteristic of 748 e/s with reference to 3 V.

Manufacture of Photoelectronic Device 4

Example 4

An ITO is sputtered on a glass substrate to form a 100 nm-thick lower electrode. On the lower electrode, molybdenum oxide (MoOx, 0<x≤3) and aluminum (Al) is thermally evaporated in a ratio of 1:1 (wt/wt) to form a 5 nm-thick lower auxiliary layer, and dicyanovinyl-terthiophene (DCV3T) is thermally evaporated thereon to form a 10 nm-thick lower auxiliary layer. On the double lower auxiliary layer, dicyanovinyl-terthiophene (DCV3T):N,N'-dimethylquinacridone (DMQA) is deposited in a ratio of 1:1 to form a 110 nm-thick active layer. On the active layer, a molybdenum oxide (MoOx, 0<x≤3) is thermally evaporated to form a 30 nm-thick upper auxiliary layer. On the upper auxiliary layer, silver (Ag) and molybdenum oxide (MoOx, 0<x≤3) are thermally evaporated in ratio of 90:10 (w/w) to form a 12 nm-thick light transmission layer. On the light transmission layer, tungsten oxide (WOx, 0<x≤3) is thermally evaporated to form a 30 nm-thick transparent auxiliary layer, manufacturing a photoelectronic device.

Evaluation 4

The photoelectronic device according to Example 4 is evaluated regarding external quantum efficiency (EQE) and leakage current.

Figure 11:
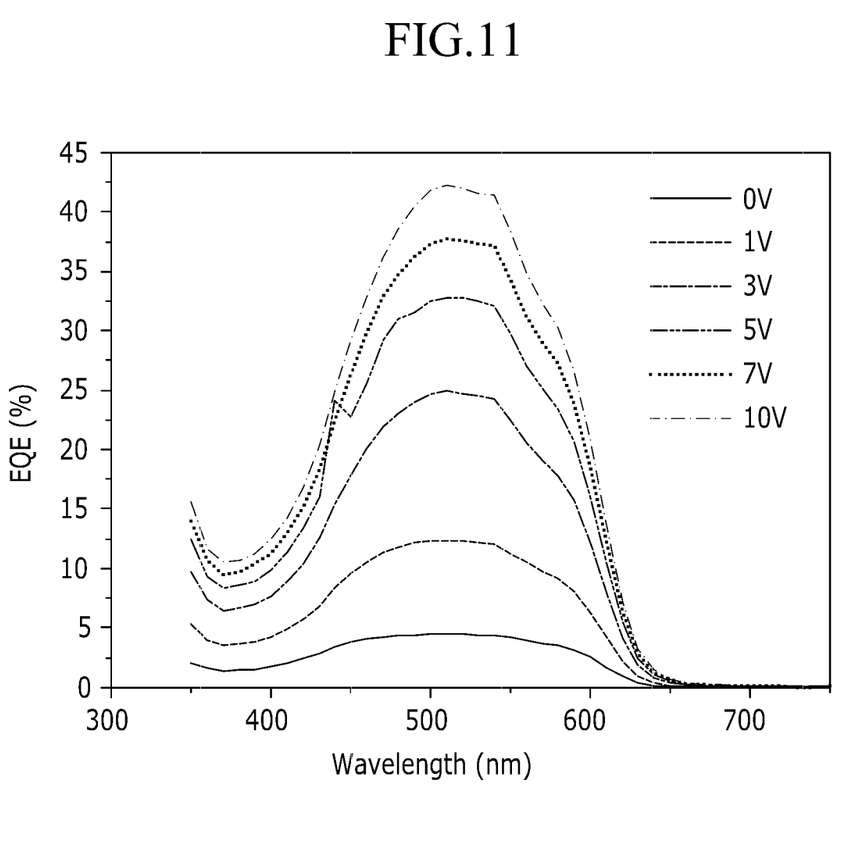
FIG. 11 is a graph showing external quantum efficiency (EQE) of the photoelectronic device according to Example 4.
Figure 12:
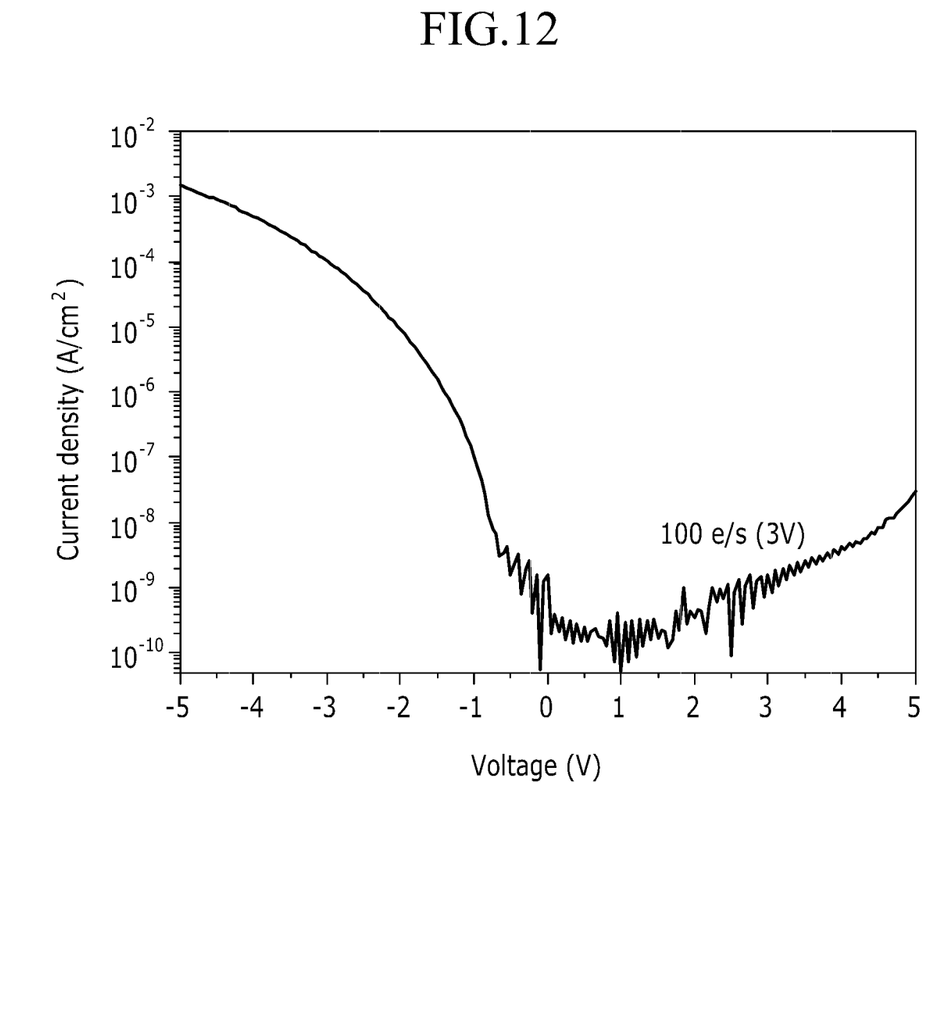
FIG. 12 is a graph showing dark current characteristics of the photoelectronic device according to Example 4.

The results are provided in FIGS. 11 and 12.

FIG. 11 is a graph showing external quantum efficiency (EQE) of the photoelectronic device according to Example 4, and FIG. 12 is a graph showing dark current characteristics of the photoelectronic device according to Example 4.

Referring to FIG. 11, the photoelectronic device according to Example 4 has light transmission electrodes on and under the active layer, but has sufficient external quantum efficiency (EQE), and specifically has external quantum efficiency (EQE) of about 25% with a reference of 3 V and 540 nm.

Referring to FIG. 12, the photoelectronic device according to Example 4 has a desirable leakage current characteristic and a dark current characteristic of 100 e/s with reference to 3 V.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A photoelectronic device, comprising:
   a first electrode;
   a second electrode facing the first electrode;
   an active layer between the first electrode and the second electrode; and
   an auxiliary layer between the first electrode and the active layer, the auxiliary layer including
   a first auxiliary layer including a metal oxide and an elemental metal, and
   a second auxiliary layer including a first organic material having a HOMO energy level of greater than or equal to about 6.0 eV.

2. The photoelectronic device of claim 1, wherein
   the first auxiliary layer contacts the first electrode, the first electrode including at least one selected from indium tin oxide (ITO), indium zinc oxide (IZO), zinc oxide (ZnO), tin oxide (SnO), aluminum tin oxide (AlTO), and fluorine-doped tin oxide (FTO), and
   a combined work function of the first electrode and first auxiliary layer is in a range of less than or equal to about 4.3 eV.

3. The photoelectronic device of claim 1, wherein the metal oxide includes one of molybdenum oxide, tungsten oxide, vanadium oxide, rhenium oxide, nickel oxide, and a combination thereof.

4. The photoelectronic device of claim 1, wherein the metal includes one of aluminum (Al), calcium (Ca), magnesium (Mg), lithium (Li), gold (Au), silver (Ag), copper (Cu), and a combination thereof.

5. The photoelectronic device of claim 1, wherein the first auxiliary layer includes the metal in a same amount as the metal oxide or in a higher amount than the metal oxide.

6. The photoelectronic device of claim 1, wherein the first auxiliary layer has a thickness of about 0.1 nm to about 5 nm.

7. The photoelectronic device of claim 1, wherein the first organic material has a HOMO energy level of about 6.0 eV to about 7.0 eV.

8. The photoelectronic device of claim 1, wherein
   the active layer includes a second organic material that is the same as or different from the first organic material, and
   the first organic material has the same LUMO energy level as the second organic material or a higher LUMO energy level than the second organic material.

9. The photoelectronic device of claim 1, wherein the first organic material includes one of DCV3T, Bpy-OXD, Bpy-FOXD, 3TPYMB, BP4MPY, BmPyPB, B3PYMPM, Bphen, and a combination thereof.

10. The photoelectronic device of claim 1, wherein the second auxiliary layer has a thickness of about 1 nm to about 20 nm.

11. The photoelectronic device of claim 1, further comprising:
    a third auxiliary layer between the active layer and the second electrode, the third auxiliary layer including a metal oxide selected from one of molybdenum oxide, tungsten oxide, vanadium oxide, rhenium oxide, nickel oxide, copper oxide, titanium oxide, and a combination thereof.

12. The photoelectronic device of claim 1, wherein the second electrode is a light transmission electrode, and the light transmission electrode includes a light transmittance layer including a metal and a metal oxide in a lesser amount than the metal, the metal including at least one selected from silver (Ag), aluminum (Al), copper (Cu), gold (Au), and an alloy thereof, and the metal oxide including one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

13. The photoelectronic device of claim 12, wherein the light transmission electrode further comprises:
a transparent auxiliary layer on one side of the light transmission layer, the transparent auxiliary layer including a material having a refractive index of about 1.6 to about 2.5.

14. An image sensor comprising the photoelectronic device of claim 1.

15. A photoelectronic device, comprising:
a first electrode;
a second electrode facing the first electrode;
an active layer between the first electrode and the second electrode; and
a first auxiliary layer between the first electrode and the active layer, the first auxiliary layer including a metal oxide and an elemental metal, and having a thickness of less than or equal to about 5 nm.

16. The photoelectronic device of claim 15, wherein the first auxiliary layer contacts the first electrode, the first electrode including at least one selected from indium tin oxide (ITO), indium zinc oxide (IZO), zinc oxide (ZnO), tin oxide (SnO), aluminum tin oxide (AlTO), and fluorine-doped tin oxide (FTO), and a combined work function of the first electrode and first auxiliary layer is in a range of less than or equal to about 4.3 eV.

17. The photoelectronic device of claim 15, wherein
the metal oxide includes one of molybdenum oxide, tungsten oxide, vanadium oxide, rhenium oxide, nickel oxide, and a combination thereof, and
the metal includes one of aluminum (Al), calcium (Ca), magnesium (Mg), lithium (Li), gold (Au), silver (Ag), copper (Cu), and a combination thereof.

18. The photoelectronic device of claim 15, wherein the first auxiliary layer includes the metal in a same or a higher amount than the metal oxide.

19. The photoelectronic device of claim 15, further comprising:
at least one of a second auxiliary layer between the first auxiliary layer and the active layer and a third auxiliary layer between the active layer and the second electrode.

20. The photoelectronic device of claim 15, wherein
the second electrode is a light transmission electrode, and
the light transmission electrode includes a light transmittance layer including a metal and a metal oxide in a lesser amount than the metal, the metal including at least one selected from silver (Ag), aluminum (Al), copper (Cu), gold (Au), and an alloy thereof, and the metal oxide including one of molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, and a combination thereof.

21. The photoelectronic device of claim 20, wherein the light transmission electrode further comprises:
a transparent auxiliary layer on one side of the light transmission layer, the transparent auxiliary layer including a material having a refractive index of about 1.6 to about 2.5.

22. An image sensor comprising the photoelectronic device of claim 15.

* * * * *